United States Patent
Gupta et al.

(10) Patent No.: US 11,671,289 B2
(45) Date of Patent: Jun. 6, 2023

(54) END OF PACKET DETECTION

(71) Applicant: NXP USA, Inc., Austin, TX (US)

(72) Inventors: Ranjeet Kumar Gupta, Phoenix, AZ (US); Siamak Delshadpour, Phoenix, AZ (US); Kenneth Jaramillo, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/474,800

(22) Filed: Sep. 14, 2021

(65) Prior Publication Data
US 2023/0079021 A1 Mar. 16, 2023

(51) Int. Cl.
| | |
|---|---|
| *H04L 25/06* | (2006.01) |
| *G01R 23/15* | (2006.01) |
| *H04B 1/12* | (2006.01) |
| *H04L 25/08* | (2006.01) |
| *H03K 5/13* | (2014.01) |
| *H03K 5/1252* | (2006.01) |

(52) U.S. Cl.
CPC ............ *H04L 25/069* (2013.01); *G01R 23/15* (2013.01); *H03K 5/13* (2013.01); *H04B 1/12* (2013.01); *H04L 25/085* (2013.01); *H03K 5/1252* (2013.01)

(58) Field of Classification Search
CPC ..... H04L 25/069; H04L 25/085; G01R 23/15; H03K 5/13; H03K 5/1252; H04B 1/12
See application file for complete search history.

(56) References Cited

U.S. PATENT DOCUMENTS

| | | | |
|---|---|---|---|
| 6,535,023 B1* | 3/2003 | Williams | H03K 5/135 327/24 |
| 7,826,581 B1* | 11/2010 | Prather | H04L 7/0337 375/376 |
| 8,804,792 B1* | 8/2014 | Cheung | H04L 25/20 710/48 |
| 2014/0006655 A1* | 1/2014 | Chan | G06F 11/3051 710/16 |
| 2019/0004590 A1* | 1/2019 | Srivastava | G06F 13/4022 |
| 2019/0295669 A1* | 9/2019 | Yang | G11C 29/023 |
| 2020/0034323 A1* | 1/2020 | Maung | G06F 13/4027 |
| 2022/0018881 A1* | 1/2022 | Delshadpour | H04B 1/16 |
| 2022/0206983 A1* | 6/2022 | Erdogan | G06F 13/4045 |
| 2022/0283624 A1* | 9/2022 | Bajpai | G06F 1/3215 |

OTHER PUBLICATIONS

Provost, B. et al; "Adaptive Analog timer for On-Chip Testing"; IEEE Proceedings fo the 3rd Int'l Workshop on Design of Mixed-Mode Integrated Circuits and Applications Jul. 28, 1999, Puerto Vallarta, MX; IEEE Explore; 4 pages (Aug. 6, 2002).

(Continued)

*Primary Examiner* — Dac V Ha

(57) ABSTRACT

Various embodiments relate to an end of packet (EOP) circuit, including: a reset pulse generator circuit configured to generate a reset pulse when a input signal transitions to a new value; an analog counter circuit configured to receive a squelch signal to start the counter and to receive the reset pulse to reset the counter; and an EOP detector circuit configured to produce a signal indicative that the input signal is an EOP signal based upon an output of the analog counter circuit.

14 Claims, 3 Drawing Sheets

(56) References Cited

OTHER PUBLICATIONS

Ichikawa, Kai et al; "Study of Input Signal Waveforms for Precise Analog Converter"; 2020 IEEE Int'l Symposium on Radio-Frequency Integration Technology (RFIT), Hiroshima, JP; 3 pages (Sep. 2020).

Embedded USB2 (eUSB2) Physical Layer Supplement to the USB Revision 2.0 Specification—Revision 1.1; retrieved from the Internet https://www.usb.org/sites/default/files/eUSB2_1p1_20180917.pdf; 158 pages (2018).

Lin, Zhihong, Texas Instruments; "Understanding the embedded USB2 (eUSB2) standard"; retrieved from the Internet https://e2e.ti.eom/blogs_/b/analogwire/posts/understarsding-embedded-usb2-eusb2; 3 pages (Aug. 19, 2019).

\* cited by examiner

END OF PACKET DETECTION

TECHNICAL FIELD

Various exemplary embodiments disclosed herein relate generally to clock free analog end of packet (EOP) detection in repeaters.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to an end of packet (EOP) circuit, including: a reset pulse generator circuit configured to generate a reset pulse when a input signal transitions to a new value; an analog counter circuit configured to receive a squelch signal to start the counter and to receive the reset pulse to reset the counter; and an EOP detector circuit configured to produce a signal indicative that the input signal is an EOP signal based upon an output of the analog counter circuit.

Various embodiments are described, including a differential to single-ended converter connected the result pulse generator circuit and differential lines of a high speed path in a signal repeater.

Various embodiments are described, wherein the analog converter circuit includes a resistor and capacitor (RC) circuit.

Various embodiments are described, wherein the EOP detector circuit compares a volage from the analog counter circuit to a threshold value to determine when to indicate that the input signal is an EOP signal.

Various embodiments are described, including a disconnect detector circuit configured to determine that the lines of a high speed path in a signal repeater are disconnected.

Various embodiments are described, wherein the disconnect detector circuit is configured to indicate that the lines of a high speed path in a signal repeater are disconnected when the voltage on the lines approximately doubles in value.

Further various embodiments relate to a high speed path circuit, including: an equalizer configured to receive a differential input signal at input lines; a gain stage configured to amplify an output of the equalizer; a line driver configured to drive output lines of high speed path based upon the output of the gain stage; a squelch detector circuit configured to detect high speed traffic on the input lines and to produce a squelch signal indicative of the presence of high speed traffic on the input lines; an end of packet (EOP) circuit, including: a reset pulse generator circuit configured to generate a reset pulse when the differential input signal transitions to a new value; an analog counter circuit configured to receive the squelch signal to start the counter and to receive the reset pulse to reset the counter; and an EOP detector circuit configured to produce a signal indicative that the input signal is an EOP signal based upon an output of the analog counter circuit.

Various embodiments are described, including a differential to single-ended converter connected between the result pulse generator circuit and input lines.

Various embodiments are described, wherein the analog converter circuit includes a resistor and capacitor (RC) circuit.

Various embodiments are described, wherein the EOP detector circuit compares a volage from the analog counter circuit to a threshold value to determine when to indicate that the input signal is an EOP signal.

Various embodiments are described, including a disconnect detector circuit configured to determine that the lines of a high speed path in a signal repeater are disconnected.

Various embodiments are described, wherein the disconnect detector circuit is configured to indicate that the lines of a high speed path in a signal repeater are disconnected when the voltage on the lines approximately doubles in value.

Further various embodiments relate to a repeater circuit, including: low speed path connected between differential inputs and differential outputs; a high speed path circuit connected between differential input lines and differential output lines, including: an equalizer configured to receive a differential input signal at the differential input lines; a gain stage configured to amplify an output of the equalizer; a line driver configured to drive the differential output lines of high speed path based upon the output of the gain stage; a squelch detector circuit configured to detect high speed traffic on the differential input lines, to active the high speed path, and to produce a squelch signal indicative of the presence of high speed traffic on the input lines; an end of packet (EOP) circuit, including: a reset pulse generator circuit configured to generate a reset pulse when the differential input signal transitions to a new value; an analog counter circuit configured to receive the squelch signal to start the counter and to receive the reset pulse to reset the counter; and an EOP detector circuit configured to produce a signal indicative that the input signal is an EOP signal based upon an output of the analog counter circuit.

Various embodiments are described, including a differential to single-ended converter connected between the result pulse generator circuit and differential input lines.

Various embodiments are described, wherein the analog converter circuit includes a resistor and capacitor (RC) circuit.

Various embodiments are described, wherein the EOP detector circuit compares a volage from the analog counter circuit to a threshold value to determine when to indicate that the input signal is an EOP signal.

Various embodiments are described, including a disconnect detector circuit configured to determine that the differential output lines of a high speed path in a signal repeater are disconnected.

Various embodiments are described, wherein the disconnect detector circuit is configured to indicate that the differential output lines of a high speed path in a signal repeater are disconnected when the voltage on the differential output lines approximately doubles in value.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
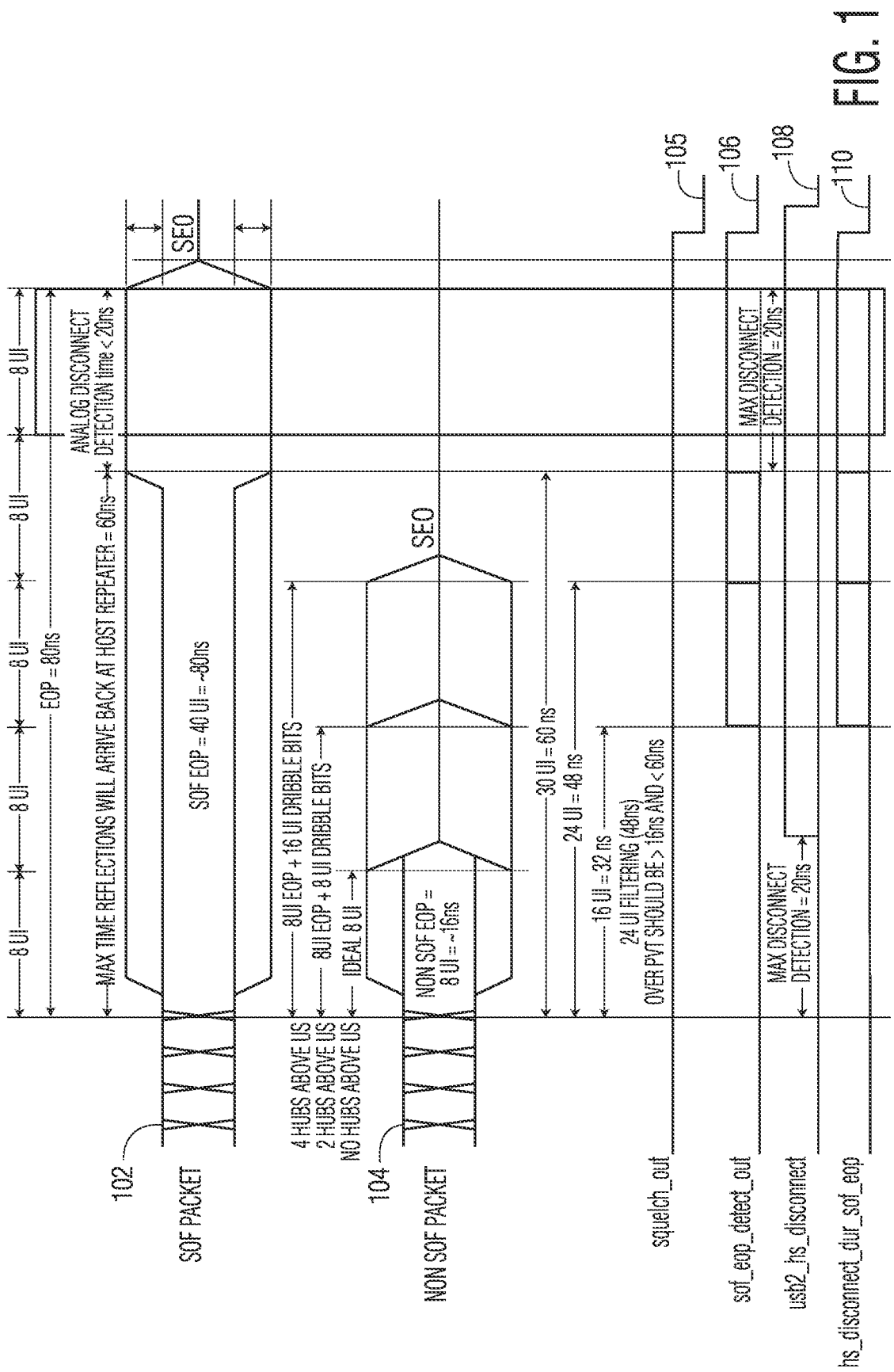
FIG. 1 illustrates the detailed timing for disconnect detection and illustrates the end of a SOF packet and the end of a non-SOF packet.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

The embedded USB2 (eUSB2) specification is a supplement to the USB2.0 specification that addresses issues related to interface controller integration with advanced circuit-on-chip (SoC) process nodes by enabling USB2.0 interfaces to operate at I/O voltages of 1V or 1.2V instead of traditional 3.3V supply. eUSB2 can enable smaller, more power-efficient SoCs, in turn enabling process nodes to continue to scale while increasing performance in applications such as smartphones, tablets and notebooks.

As applications like smartphones and tablets continue to pack more and more components into smaller form factors, it is essential that interfaces shrink as well. However, the continued shrinking of SoC node size has led to a thinner gate oxide that can only support lower voltages. For devices relying on USB2.0 interfaces, this trend can lead to complicated design challenges for advanced process nodes.

When process nodes reach 7 nm, quantum effects begin impacting high-signaling-voltage inputs/outputs (I/Os) such as 3.3V and can no longer be easily supported. Many device-to-device interfaces already support low signaling voltages, but USB2.0 still requires a 3.3V I/O voltage to operate.

USB2.0 has been the most successful wired interface in the past 20 years, and almost all SoCs today are equipped with the USB2.0 interface. USB standards evolution kept the original 3.3V I/O USB 1.0 interface intact for backward compatibility, helping enable wider adoption and a larger ecosystem while also preserving device interoperability.

As process nodes approach smaller features (e.g. 5 nm), the manufacturing cost to maintain USB2.0 3.3V I/O signaling has grown exponentially. eUSB2 addresses the I/O voltage gap as a physical layer supplement to the USB2.0 specification so that designers can integrate the eUSB2 interface at the device level while leveraging and reusing the USB2.0 interface at the circuit level.

eUSB2 can support onboard inter-device connectivity through direct connections as well as exposed connector interfaces through an eUSB2-to-USB2.0/USB2-to-eUSB2 repeater, to perform level shifting While USB2.0 can continue to be integrated into SoCs with process features of 7 nm and above, eUSB2 is a good fit for SoCs when process features are 5 nm and below. eUSB2 can also be integrated into other devices to easily interconnect with SoCs as a device-to-device interface. USB2.0 will continue serving as the standard connector interface.

eUSB2 allows significant I/O power reduction and improves power efficiency, while enabling process features to continue to scale.

A USB2/eUSB2 repeater includes a USB2 port and an eUSB2 port. Bidirectional traffic may be carried by the repeater include low speed (LS), full speed (FS), and high speed (HS) traffic. The repeater may have different voltage domains that serve the different ports. For example, a 1.8V source may be used to power the circuits related to the eUSB2 port, and a 3.3V source may be used to power the circuits related to the USB2 port. Each of the USB2 pins faces ~3.6V voltage in LS/FS mode and<1.1V signal in HS mode (0.44V in functional mode and<1.1V in chirp mode), so it is assumed that the maximum signal in each of the USB2 pins during the HS-RX mode will be 1.1V). Alternatively 1.2V or 1.0V supply can be used to support operations on eUSB port.

In an eUSB/USB2 repeater, disconnect detection during HS mode requires accurate timing for reliable detection of device disconnect. As per the USB 2.0 protocol requirement, high-speed disconnect detection can be done only during special packets called Start of Frame (SOF) packets. SOF packets have a longer End of Packet (EOP) of 40 non-toggling bits to allow the signal to reflect back from the far end of the cable and double the voltage levels for reliable disconnect detection within long EOP bit lengths.

Prior art circuits use Clock and Data Recovery (CDR) circuits for detection of the SOF EOP packets, but it is expensive from area and power perspective to implement a clock. eUSB-USB2 repeaters without CDR and an accurate clock that operates using a local clock (e.g., based on ring oscillators) do not provide an accurate enough clock to meet the timing requirement of SOF EOP detection and disconnect detection. Embodiments of a circuit and method to reliably detect the long EOP on the SOF USB HS packets is described herein. The described architecture offers less complexity and consumes less area and power as compared to traditional methods using CDR and accurate clocks (PLL and XO). A simple and reliable analog solution is presented which removes need of an accurate clock or a synchronizing scheme.

FIG. 1 illustrates the detailed timing for disconnect detection and illustrates the end of a SOF packet and the end of a non-SOF packet. FIG. 1 includes signal plots of the SOF packet 102, non-SOF packet 104, squelch_out 105, sof_eop_detect_out 106, usb2_hs_disconnect 108, and hs_disconnect_dur_sof_eop 110. The SOF packet 102 has a much longer EOP (i.e., 40 unit intervals (UI)=~80 ns) than does the non-SOF packet 104 (i.e., 8 UI=~16 ns). If the device is disconnected, then the long SOF packet EOP 102 allows plenty of time for the high speed signal to reach the far-end of the cable, reflect back (doubling its voltage), and reaching the repeater in time to detect the disconnect before the packet ends.

A 30 UI filter (±10%) watches the HS data to detect the SOF EOP pattern and detects 30 UI of valid data (i.e, when squelch_out=1, meaning that the squelch detector has detected high-speed traffic) which has remained constant. Presence of high speed traffic is indicated by "squelch_out" 105. During high-speed bit stream if there is no transition for 30 UI, output of the sof eop detector is indicated by the analog sof_eop_detect_out signal 106 going high. A threshold of 30 UI is chosen because it eliminates the possibility of a non-SOF EOP 104 from looking like a disconnect because that EOP is only 8 UI long. As a result, the minimum filtering could go ideally as low as 8 UI for the filter. Depending on how many hubs are possible above the host repeater, dribble bits would extend the non SOF EOP 104 from 8 UI up to 24 UI (4 possible hubs=4 dribble bits per hub*4 hubs=16 extra EOP bits). The repeater may also introduce up to 3 UI of dribble because the squelch assertion delay is up to 3 UI. So that means the minimum filtering should not be 8 UI but something larger like around 27 UI. This allows for 4 hubs as well as the repeater's own dribble. With margin, a filter length of something like 30 UI±10% should be selected. This would place the maximum SOF EOP detection at 33 UI providing 7 UI (14 ns) left for detection of the disconnect and latching that status. Because the disconnect detector runs in parallel with this, the tolerance of the SOF EOP detector could be relaxed a bit as long as the minimum was still>27 UI.

Note that the max time the reflection could show up due to a long cable is around 60 ns after the EOP starts for a max allowed cable length of 5 m. That leaves us at most 20 ns to detect the disconnect. A disconnect detector block can be designed for a response time of less than 12 ns so there is plenty of margin. Disconnect detector response time trades off with block power consumption. So, targeting faster response time would lead to higher power consumption.

The USB 2.0 specification requirement for HS disconnect detection includes the following. A downstream facing transceiver operating in HS mode detects disconnection of a HS device by sensing the doubling in differential signal amplitude across the D+ and D− lines that can occur when the device terminations are removed. The disconnection envelope detector output goes high when the downstream facing transceiver transmits and positive reflections from the open line return with a phase which is additive with the transceiver driver signal. Signals with differential amplitudes≥625 mV must reliably activate the Disconnection Envelope Detector. Signals with differential amplitudes≤525 mV must never activate the Disconnection Envelope Detector.

To assure that this additive effect occurs and is of sufficient duration to be detected, the EOP at the end of a high-speed SOF is lengthened to a continuous string of 40 bits without any transitions. This length is sufficient to guarantee that the voltage at the downstream facing port's connector will double, since the maximum allowable round trip signal delay is 30 bit times.

When a downstream facing port is transmitting in high-speed mode and detects that it has sent 32 bits without a transition, the disconnection envelope detector's output must be sampled once during transmission of the next 8 bits at the transceiver output. In the absence of bus errors, the next 8 bits will not include a transition. If the sample indicates that the disconnection detection threshold has been exceeded, the downstream facing port must indicate that the high-speed device has been disconnected.

The following are the system level requirements for SOF/EOP detection. As described above, in USB2 high-speed (HS) communication, the host detects the absence of the device during the SOF packet. SOF packets have longer EOP non toggling HS bit-stream at the end of the packet. Any regular USB2 HS packet has 8 UI of non-toggling HS bit-stream (i.e., short EOP). The SOF EOP packet has 40 UI of non-toggling HS bit-stream (i.e., long EOP). A SOF EOP detector circuit detects the presence of long EOP in the HS eUSB packets. An implemented eUSB/USB2 bi-directional repeater chip only acts and informs the host of the disconnect event only during the last 8 bits of the SOP EOP packet. Disconnect detection is done by a disconnect detector circuit based on HS termination being removed due to the cable being detached or the termination removed. When the termination is removed, the HS signal reflects from far-end of the cable and the amplitude doubles. When the amplitude level is higher than disconnect detect threshold, it is seen as a disconnect condition by the disconnect detector circuit. eUSB-USB2 repeater ignores disconnect detect event for any regular packets with regular EOP bit lengths. In an implemented eUSB/USB2 bi-directional repeater chip, the SOF EOP detect threshold may be set to 30 UI(±10%) to meet the system level requirement as described above.

In eUSB repeaters, there is no high frequency clock to recover the high-speed data. Repeaters should detect the disconnect condition on the USB2 bus only during SOF packets, and it requires detection of more than 27 UI of non-toggling data (long EOP) in the incoming high-speed packets. This is a must have requirement for the operation of the eUSB repeaters. Long EOP detection is implemented based on analog counter counting the number of non-toggling bits. The analog counter uses squelch detector output as start of the counter signal that means the counter is reset during HS idle condition and starts counting at the start of the packet when activity is detected by squelch detector. When any toggle occurs in the incoming data, counter is reset to 0. The SOF EOP detect block uses the analog counter output to detect the number of non-toggling incoming bits. When less than 27 UI non-toggling input data bits are received, the SOF EOP detect output stays low. When more than 33 UI non-toggling input data bits are received, the SOF EOP detect output goes high. Apart from SOF EOP detection, the disconnect detector block is monitoring signal amplitude level. The disconnect detector block output goes high when the USB2 differential output level doubles due to absence of device (missing high-speed device receiver termination). When both the disconnect detect output and SOF EOP detect output goes high, it is seen as disconnect event and the output is latched. The eUSB host is informed about the disconnect event on the USB2 bus by driving the extended SE1 on eUSB bus by eUSB-USB2 repeater.

Figure 2:
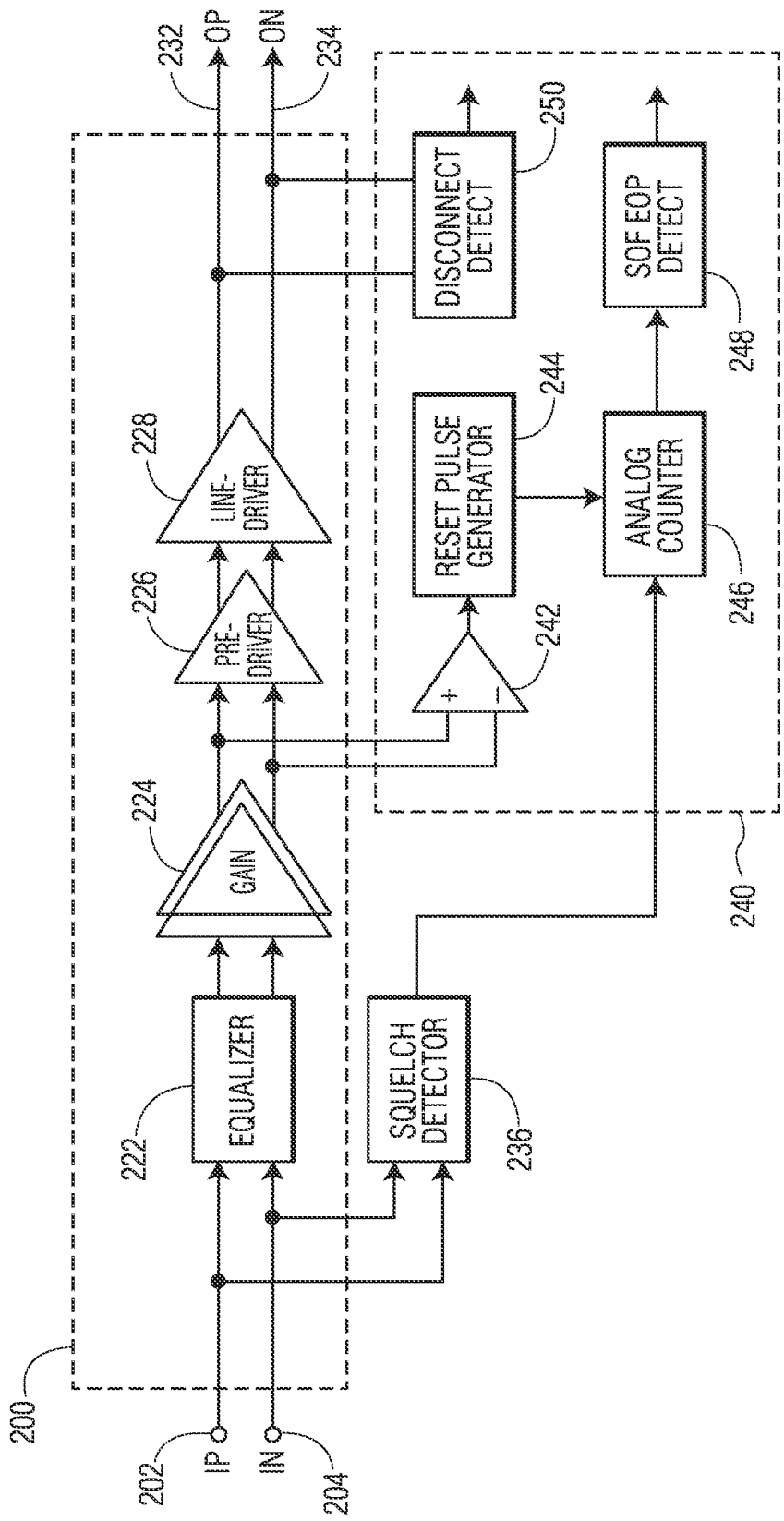
FIG. 2 illustrates the high speed path of a eUSB to USB2 repeater with a SOF EOP detector.

FIG. 2 illustrates the high speed path of a eUSB to USB2 repeater with a SOF EOP detector. The high speed path 200 includes differential eUSB input pins 202, 204 that receive a differential input signal from eUSB host. The incoming eUSB signal passes through an equalizer 222 that may be a continuous time linear equalizer (CTLE). The output of the equalizer 222 then passes through gain stages 224 to amplify the signal. Next, a pre-driver 226 receives the amplified signal and processes it and outputs it to a transmit (TX) driver 228. The TX driver 228 then transmits the USB2 signal to differential USB2 pins 232, 234.

The equalizer 222 removes most of the inter-symbol interference (ISI) that is introduced by the transmission channel at its input. The gain stages 224 make a (non-linear) hard decision and makes the equalized signal high or low. That avoids propagation of amplitude noise and allows regeneration of pre-emphasis but turns residual ISI into non-equalizable timing jitter.

The high-speed path 200 may practically be considered for a eUSB/USB2 high-speed repeater. The high-speed path 200 illustrates a TX driver 228, but de-emphasis may be added to TX driver 228 as well.

FIG. 2 also illustrates how SOF EOP detections fits in the high-speed path 200. A squelch detector 236 receives the differential input signal at the inputs 202 and 204. The squelch detector 236 detects when the input signal is above a threshold value indicating the presence of a HS signal at the inputs 202 and 204. The output of the squelch detector is used to activate the high-speed path 200 so that it can process the received HS signal. That is part of a standard eUSB to USB2 repeater. The output of the squelch detector 236 is also used by the SOF EOP detection circuit 240.

The SOF EOP detection circuit 240 includes a differential to single-ended (DSE) converter 242, a reset pulse generator 244, an analog counter 246, a SOF EOP detector 248, and a disconnect detector 250. As illustrated, the equalized signal output by the equalizer 222 is used as the signal to be evaluated to determine if the SOF EOP has been received. However, if the output of the equalizer 222 is taken directly, the differential-to-single will load the equalizer 222 and its output kick back may add extra noise to the equalizer 222 output to the whole HS path. As a result it is better that the amplified and CMOS level signal from the gain stages 224 be used as is shown in in FIG. 2. It should be mentioned that the signal to be evaluated can be taken from any node before the TX driver as well.

The output of the squelch detector 236 enables the analog counter 246. The analog counter 246 is an analog circuit including an resistor and capacitor (RC) charging circuit. The application of a voltage to the capacitor of the RC charging circuit will cause the voltage of the capacitor to increase with a known time constant based upon the resistance value of the resistor and the capacitance value of capacitor. As a result, a specific time is associated with a specific voltage value that results when a voltage is applied, and hence once the voltage on the capacitor reaches a certain known value a certain amount of time has passed, so the RC charging circuit can be used as an analog counter 246.

The charge in the analog counter 246 may be reset to restart the counter. The DSE converter 242 converts the differential signal from the highspeed path into a single-ended signal. The reset pulse generator 244 receives the output of the DSE converter 242 and produces a reset pulse when there is a transition in the value of the differential signal in the HS path. Such a transition of the differential signal indicates that the signal on the HS path is not the SOF EOP signal which remains constant for at least 30 UIs. The analog counter 246 may include a switch that grounds the capacitor to remove the charge from the capacitor to reset the counter when a pulse is received from the reset generator. The pulse would be long enough to activate the switch long enough to ground the capacitor. As precise values of the resistance and capacitor are needed in order to have an accurate time constant and hence for the analog counter 246 to be accurate, a trimming circuit may be included with the analog counter. The trimming circuit allows for the one or both of the values of the resistance and the capacitance to trimmed to values that provide the needed RC time constant. This trimming may be done during the ATE production test of the circuit.

The SOF EOP detector 248 receives the output of the analog counter 246 and compares it to a threshold value. The threshold value corresponds to a time value that indicates that the signal in the HS path has not transitioned for the required amount of time indicating that a SOF EOP has been received, and the SOF EOP detector 248 outputs a signal indicating the receipt of the SOF EOP packet.

The SOF EOP detection circuit 240 may also include a disconnect detector 250. The disconnect detector 250 as described above, will monitor the voltage on the differential HS path, and when that voltage approximately doubles due to a reflection, the disconnect detector 250 will indicate that the line has been disconnected.

The SOF EOP detection circuit 240 includes the following features. The squelch output is used to charge the capacitor in the analog counter 246. Any transition in the signal on the HS path is detected by the rest pulse generator 244 that creates a pulse to discharge the capacitance value to zero in order to reset analog counter 246. which means that counting starts over. The SOF EOP detection circuit 240 is only enabled when squelch output is high meaning that there is activity in the HS path. When no HS transition for 30 UIs occurs, the SOF EOP detector output goes high indicating SOF EOP detection. Trimming may be done to the RC circuit in the analog counter 246 to control the process variation within the target time limits.

Figure 3:
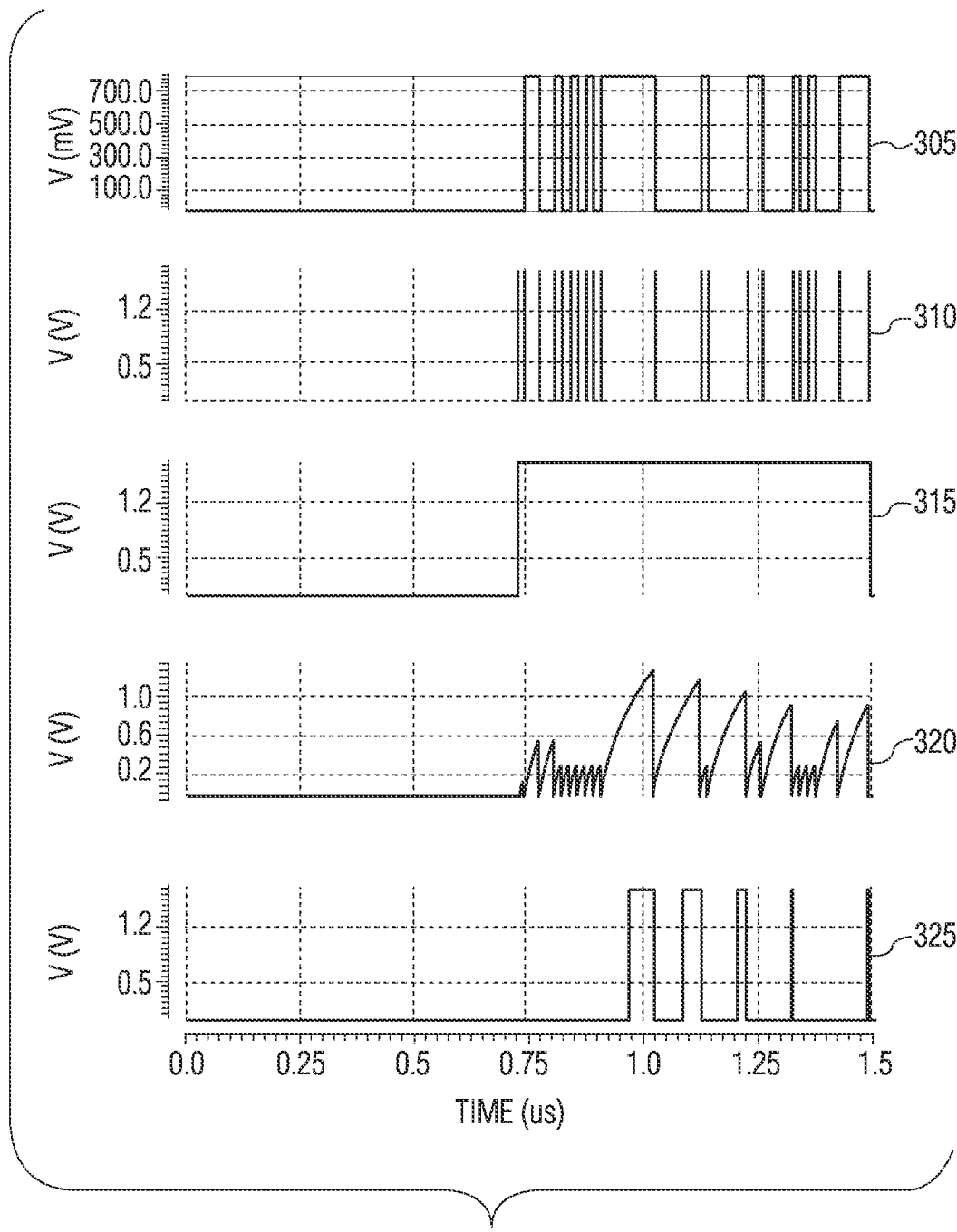
FIG. 3 shows voltage plots for the signal along the HS path, the reset pulse, the squelch signal, the output of the analog counter, and the output of the SOF EOP detector.

FIG. 3 shows voltage plots for the signal along the HS path, the reset pulse, the squelch signal, the output of the analog counter, and the output of the SOF EOP detector. The plot of the signal along the HS path 305 shows the value of the signal changing over time. As can be seen the plot 305 shows the signal along the HS path changing and holding values at different times. The plot of the reset pulse shows that a reset pulse occurs each time the signal along the HS path 305 transitions between values. The squelch signal 315 becomes high when there is data traffic on the HS path as shown. The output of the analog counter 320 shows a rising signal with a typical RC characteristic. The output of the analog counter 320 rises until a reset pulse resets the value back to zero, and this characteristic can be seen in the plot 320. Finally, the plot 325 of the output of the SOF EOP detector becomes high when the output of the analog counter 320 exceeds a threshold value as shown.

The proposed solution may be used for any high-speed circuit which prefers to work without a clock and that needs to count a certain time frame. The example solution described herein is applied to an eUSB/USB2 repeater and offers a simple and reliable analog solution and removes need to an accurate clock or synchronizing scheme.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An end of packet (EOP) circuit, comprising:
   a reset pulse generator circuit configured to generate a reset pulse when an input signal transitions to a new value;
   an analog counter circuit configured to receive a squelch signal to start the counter and to receive the reset pulse to reset the counter;
   an EOP detector circuit configured to produce a signal indicative that the input signal is an EOP signal based upon an output of the analog counter circuit; and a differential to single-ended converter connected between the reset pulse generator circuit and differential lines of a high speed path in a signal repeater.

2. The EOP circuit of claim 1, wherein the analog counter circuit includes a resistor and capacitor (RC) circuit.

3. The EOP circuit of claim 2, wherein the EOP detector circuit compares a voltage from the analog counter circuit to a threshold value to determine when to indicate that the input signal is an EOP signal.

4. The EOP circuit of claim 1, comprising a disconnect detector circuit configured to determine that the differential lines are disconnected.

5. The EOP circuit of claim 4, wherein the disconnect detector circuit is configured to indicate that the differential lines are disconnected when voltage on the differential lines approximately doubles in value.

6. A high speed path circuit, comprising:
an equalizer configured to receive a differential input signal at input lines;
a gain stage configured to amplify an output of the equalizer;
a line driver configured to drive output lines of high speed path based upon the output of the gain stage;
a squelch detector circuit configured to detect high speed traffic on the input lines and to produce a squelch signal indicative of the presence of high speed traffic on the input lines;
an end of packet (EOP) circuit, comprising:
a reset pulse generator circuit configured to generate a reset pulse when the differential input signal transitions to a new value;
an analog counter circuit configured to receive the squelch signal to start the counter and to receive the reset pulse to reset the counter; and
an EOP detector circuit configured to produce a signal indicative that the input signal is an EOP signal based upon an output of the analog counter circuit, wherein the EOP detector circuit compares a voltage from the analog counter circuit to a threshold value to determine when to indicate that the input signal is an EOP signal.

7. The high speed path circuit of claim 6, comprising a differential to single-ended converter connected between the reset pulse generator circuit and input lines.

8. The high speed path circuit of claim 6, wherein the analog counter circuit includes a resistor and capacitor (RC) circuit.

9. The high speed path circuit of claim 6, comprising a disconnect detector circuit configured to determine that lines of the high speed path are disconnected.

10. The high speed path circuit of claim 9, wherein the disconnect detector circuit is configured to indicate that lines of the high speed path are disconnected when voltage on the lines approximately doubles in value.

11. A repeater circuit, comprising:
low speed path connected between differential inputs and differential outputs;
a high speed path circuit connected between differential input lines and differential output lines, comprising:
an equalizer configured to receive a differential input signal at the differential input lines;
a gain stage configured to amplify an output of the equalizer;
a line driver configured to drive the differential output lines of a high speed path based upon the output of the gain stage;
a squelch detector circuit configured to detect high speed traffic on the differential input lines, to active the high speed path, and to produce a squelch signal indicative of the presence of high speed traffic on the input lines;
an end of packet (EOP) circuit, comprising:
a reset pulse generator circuit configured to generate a reset pulse when the differential input signal transitions to a new value;
an analog counter circuit configured to receive the squelch signal to start the counter and to receive the reset pulse to reset the counter;
an EOP detector circuit configured to produce a signal indicative that the input signal is an EOP signal based upon an output of the analog counter circuit; and
a disconnect detector circuit configured to determine that the differential output lines configured to determine that the differential output lines are disconnected when voltage on the differential output lines approximately doubles in value.

12. The repeater circuit of claim 11, comprising a differential to single-ended converter connected between the reset pulse generator circuit and the differential input lines.

13. The repeater circuit of claim 11, wherein the analog counter circuit includes a resistor and capacitor (RC) circuit.

14. The repeater circuit of claim 13, wherein the EOP detector circuit compares a voltage from the analog counter circuit to a threshold value to determine when to indicate that the input signal is an EOP signal.

* * * * *